(12) United States Patent
Takamura

(10) Patent No.: US 7,449,829 B2
(45) Date of Patent: Nov. 11, 2008

(54) ORGANIC ELECTROLUMINESCENCE DISPLAY DEVICE AND INFORMATION TERMINAL THEREOF

(75) Inventor: Makoto Takamura, Kyoto (JP)

(73) Assignee: Rohm Co., Ltd., Kyoto-Shi, Kyoto (JP)

( * ) Notice: Subject to any disclaimer, the term of this patent is extended or adjusted under 35 U.S.C. 154(b) by 10 days.

(21) Appl. No.: 10/645,504

(22) Filed: Aug. 22, 2003

(65) Prior Publication Data
US 2004/0036412 A1    Feb. 26, 2004

(30) Foreign Application Priority Data
Aug. 23, 2002    (JP)    ............ P. 2002-243306

(51) Int. Cl.
*H05B 33/00*    (2006.01)
(52) U.S. Cl. ............................... 313/504; 313/506

(58) Field of Classification Search ................ 313/498, 313/504, 505, 506, 509, 512
See application file for complete search history.

(56) References Cited
U.S. PATENT DOCUMENTS
5,837,391 A * 11/1998 Utsugi ............... 428/690
6,297,516 B1 * 10/2001 Forrest et al. ............ 257/40

FOREIGN PATENT DOCUMENTS
JP        06-176870    *    6/1994

* cited by examiner

*Primary Examiner*—Ashok Patel
(74) *Attorney, Agent, or Firm*—Buchanan Ingersoll & Rooney PC

(57) ABSTRACT

The invention provides an organic EL display device in which at least two electrodes and organic EL layers are alternately provided on a substrate respectively, and the electrodes thus provided have an anode and a cathode formed alternately. In the organic EL display device according to the invention, at least two organic EL layers are provided. As compared with a conventional organic EL display device having one organic EL layer, therefore, an emission luminance is increased to be a double or more.

4 Claims, 3 Drawing Sheets

FIG. 5
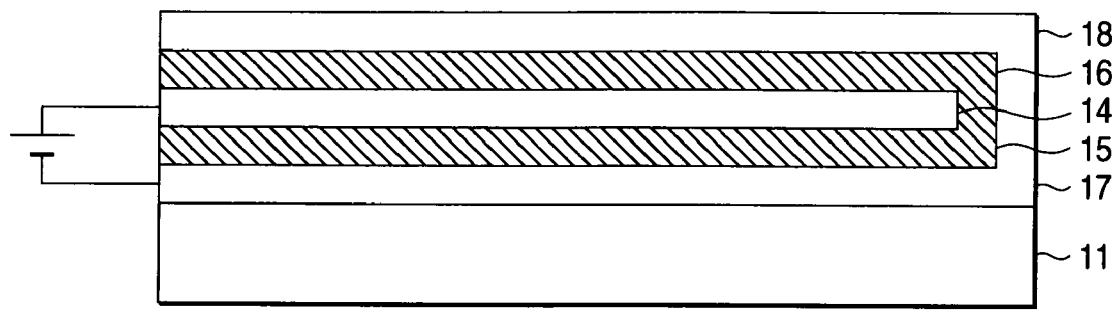
FIG. 6 (a)
FIG. 6 (b)
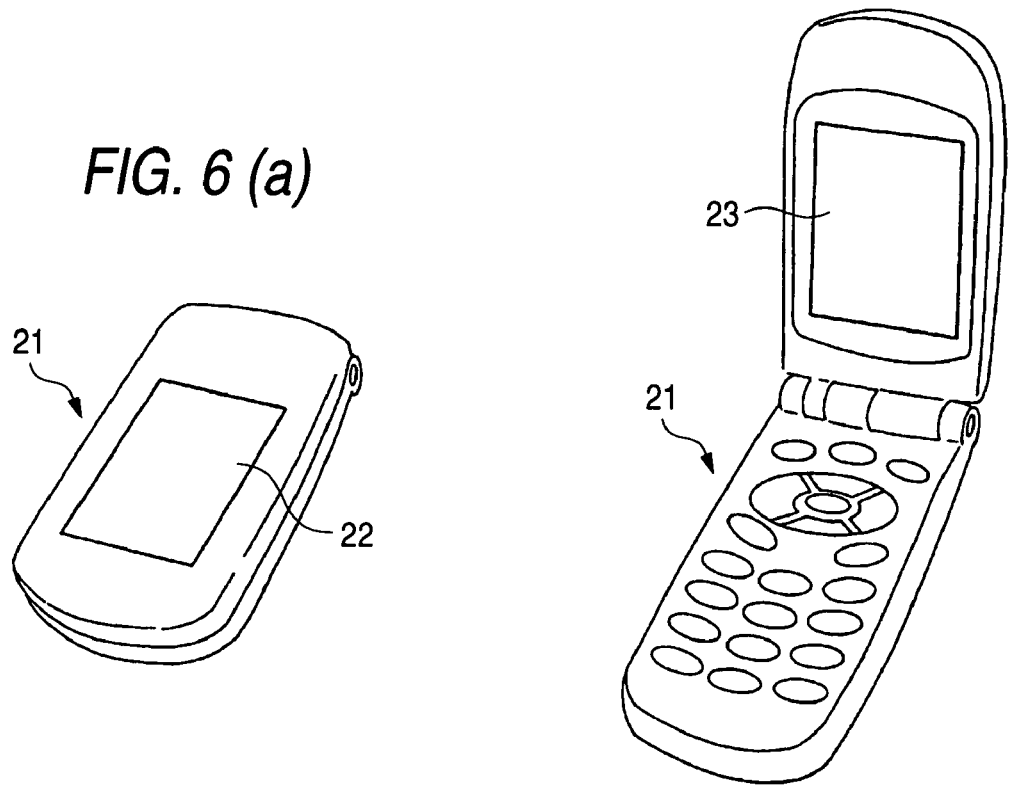

ORGANIC ELECTROLUMINESCENCE DISPLAY DEVICE AND INFORMATION TERMINAL THEREOF

BACKGROUND OF THE INVENTION

1. Field of the Invention

The present invention relates to a portable terminal comprising an organic electroluminescence (the "electroluminescence" will be hereinafter referred to as "EL") display device and an organic EL display device.

2. Description of the Related Art

FIG. 1 shows the structure of a conventional organic EL display device. In FIG. 1, 41 denotes a glass substrate, 42 denotes an anode, 43 denotes a cathode and 44 denotes an organic EL layer. In the organic EL display device, the anode 42, the organic EL layer 44 and the cathode 43 are provided on the upper surface of the transparent glass substrate 41.

In order to operate the conventional organic IL display device, a dc voltage or a signal voltage is applied between the anode 42 and the cathode 43 to carry out EL light emission through the organic EL layer 44.

With the structure of the conventional organic EL display device, the organic EL layer is constituted by only one layer. Therefore, an emission luminance is obtained in accordance with a quantum efficiency caused by the material and structure of the organic EL layer.

SUMMARY OF THE INVENTION

In order to solve such a problem, it is an object of the invention to enhance the emission luminance.

A first aspect of the invention is directed to an organic EL display device having at least two organic EL layers and electrodes provided alternately on an upper layer of an electrode formed on a substrate respectively, wherein the electrodes provided on the substrate have an anode and a cathode formed alternately. At least two organic EL layers are provided. When the same signal is applied between each anode and each cathode in such a manner that the same video or the same color is displayed on the organic EL layer, therefore, an emission luminance is increased depending on the number of the organic EL layers as compared with a conventional organic EL display device having one organic EL layer. When different signals are applied between the anodes and the cathodes, furthermore, it is possible to display a superposed video or to regulate a color tone. With this structure, moreover, the electrode has the anode and the cathode provided alternately. Consequently, a difference in a potential between the electrodes on both ends is not considerably increased.

A second aspect of the invention is directed to an organic EL display device having at least two organic EL layers and electrodes provided alternately on an upper layer of an electrode formed on a substrate respectively, wherein the odd-numbered electrodes which are provided are connected to a first electrode terminal and the even-numbered electrodes which are provided are connected to a second electrode terminal. Consequently, an emission luminance is increased depending on the number of the organic EL layers as compared with the conventional organic EL display device having one organic EL layer. With this structure, moreover, a difference in a potential between the electrodes is equal to that of the conventional organic EL display device having one organic EL layer.

A third aspect of the invention is directed to the organic EL display device according to the first or second aspect of the invention, wherein an electrode for transmitting a light which is EL emitted is set to be a transparent electrode, and a metal film is formed of an alkaline metal or an alkaline earth metal, their metal fluorides, their metal oxides or an alloy of these metals and another metal on a boundary between any of the electrodes which is to be the cathode and the organic EL layer. There is a method of thinning the cathode of the organic EL display device or setting the cathode to be the transparent electrode in order to transmit an EL emitted light through the cathode. If a normal metal is thinned, a resistance value is increased and an applied voltage is raised. In the case in which the cathode is set to be a transparent electrode such as an ITO, an electron injection efficiency is deteriorated so that the EL emission cannot be efficiently carried out. Therefore, if the cathode is formed by the transparent electrode and a thin metal film is formed by an alkaline metal or an alkaline earth metal, their metal fluorides, their metal oxides or an alloy of these metals and another metal on the boundary between the transparent electrode and the organic EL layer, a rise in a resistance value can be suppressed and a transparency can be maintained, and efficient EL emission can be implemented. Therefore, it is possible to fetch an EL emitted light to the substrate side, the opposite side of a substrate or both of them. Li, Na, K, Rb or Cs can be applied to the alkaline metal. Mg, Ca, Sr or Ba can be applied to the alkaline earth metal. These metal fluorides are represented by LiF. These metal oxides are represented by CaO. These metal alloys are represented by MgAg. If the thickness of the metal film is less than 0.5 nm, the transparent electrode is hard to coat. Therefore, it is preferable that the thickness of the metal film should be equal to or more than 0.5 nm. The fluoride and the oxide have insulating properties. If the thickness of the film is not reduced, the effect of injecting an electron is reduced. Consequently, it is preferable that the metal films formed of these metal fluorides or oxides should have thicknesses of 2 nm or less. It is more preferable that the thicknesses should be equal to or smaller than 1 nm.

A fourth aspect of the invention is directed to an information terminal comprising the organic EL display device according to any of the first to third aspects of the invention. The information terminal comprising the organic EL display device according to any of the first to fourth aspects of the invention features that an emission luminance is high at a comparatively low voltage and double-sided display can be carried out. The information terminal includes a portable terminal having a display section, for example, a cell phone or a PDA (Personal Digital Assistant), and a computer having a display section, for example, a notebook personal computer or a desktop personal computer.

Each of these structures can be combined as much as possible.

BRIEF DESCRIPTION OF THE DRAWINGS

FIG. 5 is a typical view including the driving circuit of the organic EL display device according to the invention, and FIGS. 6(a) and 6(b) show the views of an appearance in a state in which the cover section of a portable terminal for double-sided display is closed and a state in which the same cover section is opened according to the invention.

DESCRIPTION OF THE PREFERRED EMBODIMENTS

First Embodiment

Figure 1:
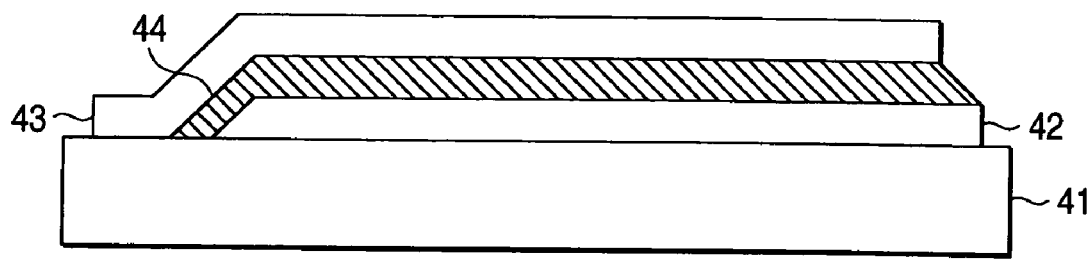
FIG. 1 is a view for explaining the structure of a conventional organic EL display device.
Figure 2:
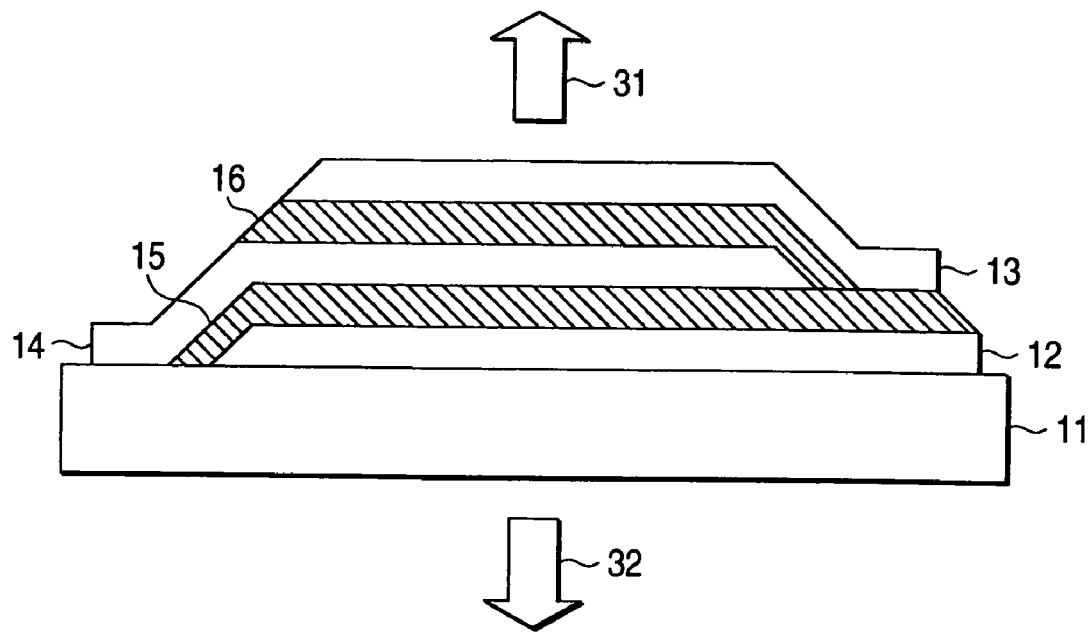
FIG. 2 is a schematic view showing an organic EL display device for explaining an embodiment of the invention.

FIG. 2 is a schematic view showing an organic EL display device for explaining an embodiment of the invention. In FIG. 2, 11 denotes a glass substrate to be a substrate, 12 denotes a first cathode, 13 denotes a second cathode, 14 denotes an anode, 15 denotes a first organic EL layer and 16 denotes a second organic EL layer. The first cathode 12, the first organic EL layer 15, the anode 14, the second organic EL layer 16 and the second cathode 13 are sequentially provided on the upper surface of the glass substrate 11. The substrate includes a glass substrate, a flexible substrate, and a substrate on which a color filter, a color converting film or a dielectric reflecting film is formed. The color filter can regulate a characteristic thereof and can optimize an efficiency and a color purity. The color converting film absorbs an EL emitted light and emits a light from the phosphor of a fluorescent converting film, thereby carrying out the color conversion of a luminescent color. A dielectric multilayer film transmits a light having a predetermined wavelength in place of the color filter. A metal capable of easily injecting a hole with a high work function is suitable for a metal electrode to be used as the anode. Therefore, it is possible to use a metal which can easily be made transparent. The metal which can easily be made transparent includes an ITO (Indium Tin Oxide), an indium zinc oxide and a tin oxide. A metal capable of easily carrying out electron injection with a low work function is suitable for metal electrodes to be used as the first cathode and the second cathode. Al, Li, Mg, Au, Ag or their alloy can be used for a cathode electrode material. The organic EL layer contains a fluorescent substance to be a compound having a light emitting function and emits a light by an EL phenomenon.

Figure 3:
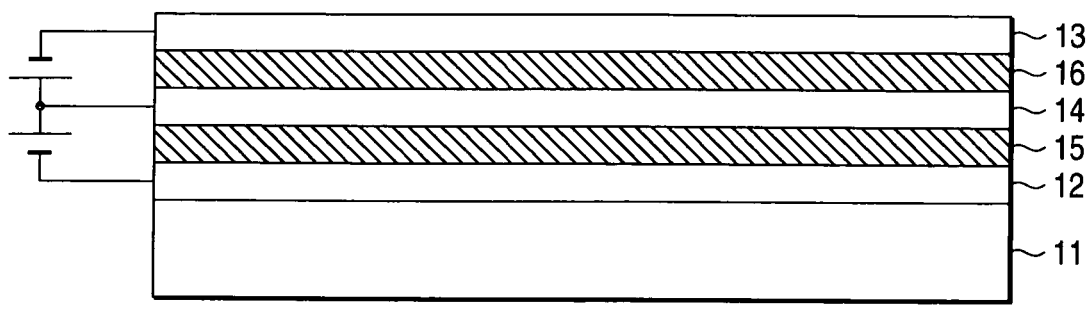
FIG. 3 is a typical view including the driving circuit of the organic EL display device according to the invention.

FIG. 3 is a typical view showing the driving circuit of the organic EL display device according to the invention. In FIG. 3, 11 denotes a glass substrate, 12 denotes a first cathode, 13 denotes a second cathode, 14 denotes an anode, 15 denotes a first organic EL layer, and 16 denotes a second organic EL layer. When a dc voltage or a signal voltage is applied between the anode 14 and the first cathode 12 in the organic EL display device in such a manner that the anode 14 is positive with respect to the first cathode 12, the first organic EL layer 15 emits a light. When a dc voltage or a signal voltage is applied between the anode 14 and the second cathode 13 in such a manner that the anode 14 is positive with respect to the second cathode 13, the second organic EL layer 16 emits a light. As a result, the organic display device exhibits an image display function or the function of a light source.

In FIG. 2, at least the glass substrate 11 is formed by a transparent material and the anode 14 and the first cathode 12 are set to be transparent electrodes in order to fetch an EL light 32 from the glass substrate 11 side. In order to fetch an EL light 31 from the opposite side of the glass substrate 11, at least the anode 14 and the second cathode 13 are set to be the transparent electrodes. In order to fetch both the EL light 32 and the EL light 31 from the glass substrate 11 side and the opposite side of the glass substrate 11 respectively, the glass substrate 11 is formed by a transparent material and the first cathode 12, the anode 14 and the second cathode 13 are set to be the transparent electrodes.

In the organic EL display device described in the embodiment, two organic EL layers are provided. When the same signal is applied between the anode and the cathode in such a manner that the same video or the same color is displayed on the organic EL layer, an emission luminance is increased to be almost a double as compared with the conventional organic EL display device in which one organic EL layer is provided. When different signals are applied between the anode and the first cathode and between the anode and the second cathode, furthermore, a superposed video can be displayed and a color tone can be regulated. With this structure, the electrodes have the anode and the cathode provided alternately. Therefore, a difference in a potential between the electrodes of the first cathode and the second cathode is not considerably increased.

Furthermore, description will be given to the structure of the organic EL display device for enhancing the efficiency of EL emission. An ITO (Indium Tin Oxide), an indium zinc oxide and a tin oxide which can easily be made transparent can be applied to the anode of the organic EL display device. However, a metal capable of easily carrying out electron injection with a low work function which is suitable for the cathode has a small light transmittance. When the cathode is thinned in order to increase the transmittance, a resistance value is increased and an applied voltage is raised. If the cathode is set to be a transparent electrode and a thin metal film is formed of an alkaline metal or an alkaline earth metal, their metal fluorides, their metal oxides or an alloy of these metals and another metal on the boundary between the transparent electrode and the organic EL layer, a rise in the resistance value can be suppressed and a transparency can be maintained. In FIG. 2, when the EL light 32 is to be fetched from the glass substrate 11 side, the first cathode 12 is set to be the transparent electrode formed of an ITO, an indium zinc oxide and a tin oxide, and a metal film is formed of an alkaline metal or an alkaline earth metal, their metal fluorides, their metal oxides or an alloy of these metals and another metal on the boundary between the first cathode 12 and the first organic EL layer 15. In order to fetch the EL light 31 from the opposite side of the glass substrate 11, the second cathode 13 is set to be a transparent electrode formed of an ITO, an indium zinc oxide or a tin oxide and a metal film is formed of an alkaline metal or an alkaline earth metal, their metal fluorides, their metal oxides or an alloy of these metals and another metal on the boundary between the second cathode 13 and the second organic EL layer 16. In order to fetch both the EL light 32 and the EL light 31 from the glass substrate 11 side and the opposite side of the glass substrate 11 respectively, both the first cathode 12 and the second cathode 13 are set to be the transparent electrodes formed of an ITO, an indium zinc oxide or a tin oxide, and a metal film is formed of an alkaline metal or an alkaline earth metal, their metal fluorides, their metal oxides or an alloy of these metals and another metal on both the boundary between the first cathode 12 and the first organic EL layer 15 and the boundary between the second cathode 13 and the second organic EL layer 16.

Thus, the cathode is set to be a transparent electrode formed of an ITO, an indium zinc oxide or a tin oxide, and a metal film is formed of an alkaline metal or an alkaline earth metal, their metal fluorides, their metal oxides or an alloy of these metals and another metal on the boundary with the organic EL layer. Consequently, a rise in a resistance value can be suppressed and a transparency can be maintained, and efficient EL emission can be implemented. It is preferable that these metal films should have thicknesses of 0.5 nm or more. The metal films of these metal fluorides or oxides preferably have thicknesses of 2 nm or less, and more preferably 1 nm or less. Moreover, a difference in a potential between the electrodes can be set to be almost equal to that of the organic EL display device in which one organic EL layer is provided.

While two organic EL layers are provided in the embodiment, the organic EL layer can be multilayered if the electrodes have an anode and a cathode provided alternately with such a structure that the organic EL layer and the electrode are provided alternately.

Second Embodiment

Figure 4:
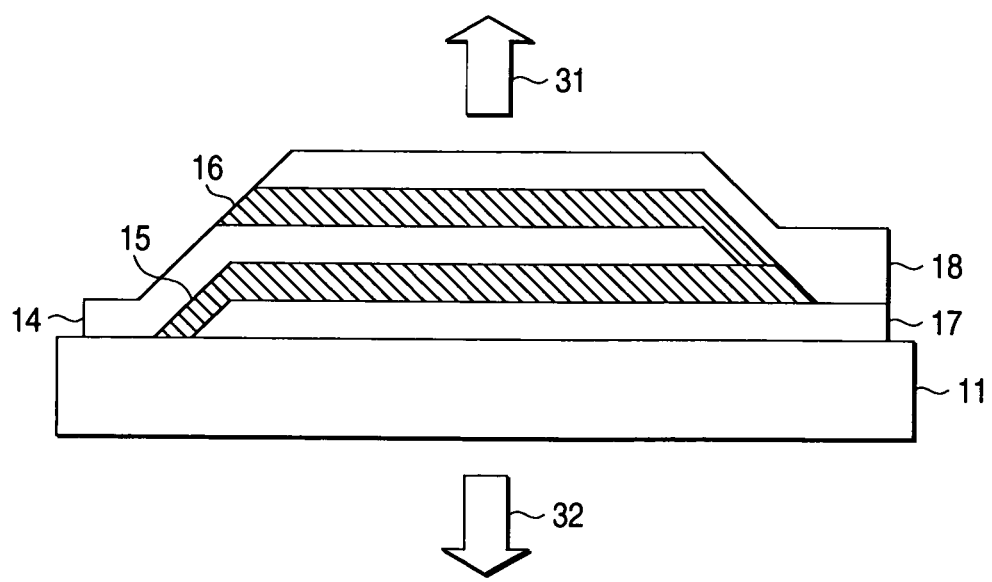
FIG. 4 is a schematic view showing the organic EL display device for explaining the embodiment of the invention.

FIG. 4 is a schematic view showing an organic EL display device for explaining an embodiment of the invention. In FIG. 4, 11 denotes a glass substrate to be a substrate, 14 denotes an anode, 15 denotes a first organic EL layer, 16 denotes a second organic EL layer, 17 denotes a first cathode, and 18 denotes a second cathode. The first cathode 17, the first organic EL layer 15, the anode 14, the second organic EL layer 16 and the second cathode 18 are sequentially provided on the upper surface of the glass substrate 11. A difference from the first embodiment is that the first cathode 17 and the second cathode 18 are connected to the same electrode terminal. Accordingly, the first cathode 17 and the second cathode 18 are equipotential.

FIG. 5 is a typical view showing the driving circuit of the organic EL display device according to the invention. In FIG. 5, 11 denotes a glass substrate to be a substrate, 14 denotes an anode, 15 denotes a first organic EL layer, 16 denotes a second organic EL layer, 17 denotes a first cathode, and 18 denotes a second cathode. When a dc voltage or a signal voltage is applied between the anode 14 and the first cathode 17 and second cathode 18 in the organic EL display device, the first organic EL layer 15 and the second organic EL layer 16 emit a light in the same manner. As a result, the organic display device exhibits an image display function or the function of a light source.

In FIG. 4, at least the glass substrate 11 is formed by a transparent material and the anode 14 and the first cathode 17 are set to be the transparent electrodes in order to fetch an EL light 32 from the glass substrate 11 side. In order to fetch an EL light 31 from the opposite side of the glass substrate 11, at least the anode 14 and the second cathode 18 are set to be the transparent electrodes. In order to fetch both the EL light 32 and the EL light 31 from the glass substrate 11 side and the opposite side of the glass substrate 11 respectively, the glass substrate 11 is formed by a transparent material and the first cathode 17, the anode 14 and the second cathode 18 are set to be the transparent electrodes.

In the organic EL display device described in the embodiment, two organic EL layers are provided. Therefore, an emission luminance is increased to be almost a double as compared with a conventional organic EL display device in which one organic EL layer is provided. With this structure, the first cathode and the second cathode are connected to each other. Therefore, a difference in a potential between the electrodes of the cathode and the first cathode or second cathode is not considerably increased.

Furthermore, description will be given to the structure of the organic EL display device for enhancing the efficiency of EL emission. An ITO (Indium Tin Oxide), an indium zinc oxide and a tin oxide which can easily be made transparent can be applied to the anode of the organic EL display device. However, a metal capable of easily carrying out electron injection with a low work function which is suitable for the cathode has a small light transmittance. When the cathode is thinned in order to increase the transmittance, a resistance value is increased and an applied voltage is raised. If the cathode is set to be a transparent electrode and a thin metal film is formed of an alkaline metal or an alkaline earth metal, their metal fluorides, their metal oxides or an alloy of these metals and another metal on the boundary between the transparent electrode and the organic EL layer, a rise in the resistance value can be suppressed and a transparency can be maintained. In FIG. 4, when the EL light 32 is to be fetched from the glass substrate 11 side, the first cathode 17 is set to be the transparent electrode formed of an ITO, an indium zinc oxide and a tin oxide, and a metal film is formed of an alkaline metal or an alkaline earth metal, their metal fluorides, their metal oxides or an alloy of these metals and another metal on the boundary between the first cathode 17 and the first organic EL layer 15. In order to fetch the EL light 31 from the opposite side of the glass substrate 11, the second cathode 18 is set to be a transparent electrode formed of an ITO, an indium zinc oxide or a tin oxide and a metal film is formed of an alkaline metal or an alkaline earth metal, their metal fluorides, their metal oxides or an alloy of these metals and another metal on the boundary between the second cathode 18 and the second organic EL layer 16. In order to fetch both the EL light 32 and the EL light 31 from the glass substrate 11 side and the opposite side of the glass substrate 11 respectively, both the first cathode 17 and the second cathode 18 are set to be the transparent electrodes formed of an ITO, an indium zinc oxide or a tin oxide, and a metal film is formed of an alkaline metal or an alkaline earth metal, their metal fluorides, their metal oxides or an alloy of these metals and another metal on both the boundary between the first cathode 17 and the first organic EL layer 15 and the boundary between the second cathode 18 and the second organic EL layer 16.

Thus, the cathode is set to be a transparent electrode formed of an ITO, an indium zinc oxide or a tin oxide, and a metal film is formed of an alkaline metal or an alkaline earth metal, their metal fluorides, their metal oxides or an alloy of these metals and another metal on the boundary with the organic EL layer. Consequently, a rise in a resistance value can be suppressed and a transparency can be maintained, and efficient EL emission can be implemented. It is preferable that these metal films should have thicknesses of 0.5 nm or more. The metal films of these metal fluorides or oxides preferably have thicknesses of 2 nm or less, and more preferably 1 nm or less. Moreover, a difference in a potential between the electrodes can be set to be almost equal to that of the organic EL display device in which one organic EL layer is provided.

While two organic EL layers are provided in the embodiment, three organic EL layers or more can be provided if the electrodes have an anode and a cathode provided alternately with such a structure that the organic EL layer and the electrode are provided alternately.

(Third Embodiment)

The invention relates to a portable terminal comprising a double-sided display organic EL display device capable of fetching an EL light from both the glass substrate side and the opposite side of the glass substrate. FIG. 6 shows the appearance of the portable terminal for double-sided display according to the invention. In FIG. 6, 21 denotes a portable terminal to be an information terminal and 22 and 23 denote a display section. FIG. 6(a) is a view showing an appearance in which the cover section of the portable terminal is closed and FIG. 6(b) is a view showing an appearance in which the cover section of the portable terminal is opened.

One of the surfaces of the organic EL display device appears in the display section 22 on the external surface of the cover section of the portable terminal, and the other surface of the organic EL display device appears in the display section 23 on the internal surface of the cover section. As compared with a portable terminal including two organic EL display devices having a conventional structure, the portable terminal according to the invention can be thinned. Moreover, the organic EL display device can have a difference in a potential between electrodes which is almost equal to that of the conventional organic EL display device. Consequently, the structure of the light source of the portable terminal can be simplified.

As shown in FIG. 6(a), vertical or transverse inverted images are displayed in the display section 22 in which the cover section of the portable terminal is closed and the display section 23 in which the same cover section is opened. At the same time, in the portable terminal in which both sides are not seen, the opening state of the cover section can be detected to display the display section 22 in a state in which the cover section is closed and to display the display section 23 in which the cover section is opened. The execution of image inversion in the driving circuit is suitable in such a manner that an image to be displayed is opposed vertically or transversely to a user. In the case in which both of the display sections are to be seen in a state in which the cover section is opened, moreover, either of the images of the display sections can also be selected and displayed opposite to the user.

While two surfaces of the organic EL display device have different sizes in the embodiment, the embodiment can also be applied to the case in which the two surfaces have the same size. Moreover, the organic EL display device is not restricted to the portable terminal but can be applied to an information terminal having a display function on both sides.

In the information terminal comprising the double-sided display organic EL display device, accordingly, the thickness of the display section of the double-sided display organic EL display device can be reduced, and furthermore, the structure of a light source can be simplified.

As described above, according to the invention, it is possible to enhance an emission luminance in the organic EL display device having a difference in a potential between electrodes. Moreover, multicolor and color control can also be obtained.

In the information terminal comprising the double-sided display organic EL display device, furthermore, the thickness of the display section can be reduced.

What is claimed is:

1. An organic electroluminescence display device comprising:
   a substrate;
   a first electrode formed on the substrate;
   a first organic electroluminescence layer provided on an upper layer of the first electrode;
   a second electrode provided on the first organic electroluminescence layer;
   a second organic electroluminescence layer provided on the second electrode; and
   a third electrode provided on the second electroluminescence layer,
   wherein at least one of the first and second electrodes is a transparent electrode for transmitting electroluminescence light emitted from the first or second electroluminescence layers,
   wherein a film is disposed between the first electrode which is a cathode and the first organic electroluminescence layer, or
   the film is disposed between the third electrode which is a cathode and the second organic electroluminescence layer,
   wherein said film is made of any one of:
   a) an alkaline metal;
   b) an alkaline earth metal;
   c) alkaline metal fluorides;
   d) alkaline earth metal fluorides;
   e) alkaline metal oxides;
   f) alkaline earth metal oxides; and
   g) an alloy or a compound of any one of a)-f) with another metal, and
   wherein a transparency of the transparent electrode can be maintained with suppressing a resistance value of the transparent electrode.

2. An information terminal comprising the organic EL display device according to claim 1.

3. An organic electroluminescence display device comprising:
   a substrate;
   a first electrode formed on the substrate;
   a first organic electroluminescence layer provided on an upper layer of the first electrode;
   a second electrode provided on the first organic electroluminescence layer;
   a second organic electroluminescence layer provided on the second electrode; and
   a third electrode provided on the second electrode,
   wherein odd-numbered electrodes which are provided are connected to a first electrode terminal and even-numbered electrodes which are provided are connected to a second electrode terminal,
   wherein at least one first and second of the electrodes is a transparent electrode for transmitting electroluminescence light emitted from the first or second electroluminescence layers,
   wherein a film is disposed between the first electrode which is a cathode and the first organic electroluminescence layer, or
   the film is disposed between the third electrode which is a cathode and the second organic electroluminescence layer,
   wherein said film is made of any one of:
   a) an alkaline metal;
   b) an alkaline earth metal;
   c) alkaline metal fluorides;
   d) alkaline earth metal fluorides;
   e) alkaline metal oxides;
   f) alkaline earth metal oxides; and
   g) an alloy or a compound of any one of a)-f) with another metal, and
   wherein a transparency of the transparent electrode is maintained and an increase in a resistance value of the transparent electrode is suppressed.

4. An information terminal comprising the organic EL display device according to claim 3.

* * * * *